United States Patent
Traub et al.

(10) Patent No.: US 10,283,454 B2
(45) Date of Patent: May 7, 2019

(54) POWER SEMICONDUCTOR MODULE

(71) Applicant: ABB Schweiz AG, Baden (CH)

(72) Inventors: Felix Traub, Birmenstorf (CH); Fabian Mohn, Ennetbaden (CH); Juergen Schuderer, Zürich (CH); Daniel Kearney, Zürich (CH); Slavo Kicin, Zürich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/819,693

(22) Filed: Nov. 21, 2017

(65) Prior Publication Data

US 2018/0090441 A1 Mar. 29, 2018

Related U.S. Application Data

(63) Continuation of application No. PCT/EP2016/061450, filed on May 20, 2016.

(30) Foreign Application Priority Data

May 22, 2015 (EP) .................................... 15168909

(51) Int. Cl.
*H01L 23/538* (2006.01)
*H01L 23/64* (2006.01)
(Continued)

(52) U.S. Cl.
CPC ........ *H01L 23/5385* (2013.01); *H01L 23/645* (2013.01); *H01L 25/072* (2013.01);
(Continued)

(58) Field of Classification Search
CPC ... H01L 23/5385; H01L 25/072; H01L 29/00; H01L 23/645; H01L 23/49811; H01L 23/3735
See application file for complete search history.

(56) References Cited

U.S. PATENT DOCUMENTS 6,642,576 B1 * 11/2003 Shirasawa ............. H01L 25/071
257/288
6,885,096 B2 * 4/2005 Hirahara ............... H01L 25/071
257/666
(Continued)

FOREIGN PATENT DOCUMENTS

EP 0688053 A1 12/1995
WO 2014021077 A1 2/2014

OTHER PUBLICATIONS

European Patent Office, International Search Report & Written Opinion issued in corresponding Application No. PCT/EP2016/061450, dated Aug. 31, 2016, 11 pp.
(Continued)

*Primary Examiner* — William Coleman
(74) *Attorney, Agent, or Firm* — Taft Stettinius & Hollister LLP; J. Bruce Schelkopf (57) ABSTRACT

The present invention relates to a power semiconductor module, comprising at least two power semiconductor devices, wherein the at least two power semiconductor devices comprise at least one power semiconductor transistor and at least one power semiconductor diode, wherein at least a first substrate is provided for carrying the power semiconductor transistor in a first plane, the first plane lying parallel to the plane of the substrate, wherein the power semiconductor diode is provided in a second plane, wherein the first plane is positioned between the substrate and the second plane in a direction normal to the first plane and wherein the first plane is spaced apart from the second plane in a direction normal to the first plane. The first plane is spaced apart from the second plane in a direction normal to the first plane, whereby the first substrate is based on a direct bonded copper substrate and the first substrate is a direct-bonded copper substrate for carrying the transistor, on which first substrate a layer of a printed circuit board is provided
(Continued)

for carrying the diode. Alternatively, the first substrate is a direct-bonded copper substrate for carrying the transistor, on which first substrate a foil is provided for carrying the diode, wherein the foil comprises an electrically insulating main body and an electrically conductive structure provided thereon for carrying the diode. Such a power semiconductor module provides a low stray inductance and/or may be built easily.

20 Claims, 4 Drawing Sheets (51) Int. Cl.
*H01L 25/07* (2006.01)
*H01L 29/00* (2006.01)
*H01L 23/373* (2006.01)
*H01L 23/498* (2006.01)

(52) U.S. Cl.
CPC .......... *H01L 29/00* (2013.01); *H01L 23/3735* (2013.01); *H01L 23/49811* (2013.01); *H01L 2224/48091* (2013.01); *H01L 2224/48137* (2013.01); *H01L 2224/49111* (2013.01); *H01L 2924/19107* (2013.01)

(56) References Cited

U.S. PATENT DOCUMENTS

| | | | | |
|---|---|---|---|---|
| 6,906,404 B2* | 6/2005 | Maly | ...................... | H01L 25/072 257/678 |
| 7,042,086 B2* | 5/2006 | Shimoida | .............. | H01L 25/071 257/723 |
| 7,279,963 B2* | 10/2007 | Passe | ...................... | H01L 24/49 257/E25.016 |
| 7,423,332 B2* | 9/2008 | Gerbsch | .............. | H01L 23/5385 257/678 |
| 7,791,208 B2* | 9/2010 | Bayerer | .................. | H01L 24/48 257/773 |
| 9,142,473 B2* | 9/2015 | Hung | .................. | H01L 23/3135 |
| 9,147,666 B2* | 9/2015 | Yoshihara | ................ | H01L 24/32 |
| 9,224,670 B2* | 12/2015 | Kaeriyama | ............. | H01L 24/49 |
| 9,379,096 B2* | 6/2016 | Denta | ............... | H01L 23/49833 |
| 9,698,701 B2* | 7/2017 | Li | ......................... | H02M 7/003 |
| 2005/0128706 A1* | 6/2005 | Maly | ..................... | H01L 23/427 361/699 |
| 2009/0039498 A1 | 2/2009 | Bayerer | | |
| 2012/0267149 A1 | 10/2012 | Oi | | |
| 2014/0152373 A1 | 6/2014 | Romas, Jr. et al. | | |

OTHER PUBLICATIONS

European Patent Office, International Preliminary Report on Patentability issued in corresponding Application No. PCT/EP2016/061450, dated Apr. 4, 2017, 8 pp.
European Patent Office, Extended Search Report issued in corresponding Application No. 15168909.8, dated Nov. 6, 2015, 6 pp.
Beckedahl et al., "Breakthrough into the third dimension—Sintered multi layer flex for ultra low inductance power modules," Proceedings of 8th International Conference on Integrated Power Systems (CIPS), 5 pp.
Biela et al., "SiC vs. Si—Evaluation of Potentials for Performance Improvement of Power Electronics Converter Systems by SiC Power Semiconductors," IEEE Transactions on Industrial Electronics, vol. 58, No. 7, 2011, pp. 2872-2882.
Johnson et al., "Integrated High Power Modules," Proceedings of 7th International Conference on Integrated Power Systems (CIPS), Mar. 6-8, 2012, Nuremberg/Germany, 10 pp.
Li et al., "Novel Packaging to Reduce Stray Inductance in Power Electronics," U.S. Department of Energy, Oak Ridge Nationaal Laboratory, Jun. 10, 2010, 15 pp.
Martin et al., "Gate Circuit Layout Optimization of Power Module Regarding Transient Current Imbalance," IEEE Transactions on Power Electronics, vol. 21, No. 5, Sep. 2006, pp. 1176-1184.
Mühlfeld et al., "Optimization of the Stray Inductance in Three-Phase MOSFET Power Modules Aided by means of PEEC Simulation," Proceedings of 13th European Conference on Power Electronics and Applications (EPE), Barcelona, 2009, 7 pp.
Rusche et al., "Influence of Stray Inductance on High-Efficiency IGBT Based Inverter Designs," Power Electronics Europe, Issue 7, 2010, 3 pp.
Li et al, "Reduction of Stray Inductance in Power Electronic Modules Using Basic Switching Cells", IEEE, 2010, 6 pp.

* cited by examiner

POWER SEMICONDUCTOR MODULE

TECHNICAL FIELD

The Invention relates to a power semiconductor module. In particular, the invention relates to a power semiconductor module showing a defined arrangement of different power semiconductor devices thereby allowing a significantly decreased stray inductance and thus an improved working behaviour of the power semiconductor module.

BACKGROUND ART

Power semiconductor modules are known as such and used in a broad application range. Power semiconductor devices may comprise power semiconductor switches which may switch currents of more than 10 A and/or voltages of more than 500V.

The trend in power semiconductor technology goes into the direction of fast-switching devices. Shorter switching times can be obtained by optimizing silicon (Si) based devices as well as using devices based on wide band gap semiconductor materials, e.g., silicon-carbide (SIC) or gallium-nitrite (GaN). However, electromagnetic parasitics in the power module give rise to severe switching distortions in power modules, thereby limiting the maximum achievable switching times.

Regarding the above, power electronics modules for fast switching semiconductors therefore require very low stray inductance.

As a general rule, the stray inductance is determined by the physical area of the commutation cell. In 2D, the current paths have to be placed next to each other. The physical area of the commutation cell is then roughly proportional to the footprint area of the substrate. In practice, the stray inductance of standard planar power modules can therefore not easily be reduced to values below ~5-10 nH. For fast switching semiconductors with rise-times of ~10 ns, this value is often not acceptable.

During switching, the current transients in the stray inductance of the commutation cell induces a voltage. During turn-on of the switch, this voltage leads to a slower commutation and higher switching losses. During turn-off of the switch, the voltage adds to the already applied DC link voltage and induces an overvoltage, thereby exerting stress on the switch and requiring de-rating.

This is described in O. Mühlfeld and F. W. Fuchs, "Optimization of the stray inductance in three-phase MOSFET power modules aided by means of PEEC simulation," in Proceedings of 13th European Conference on Power Electronics and Applications (EPE), 2009. According to this document, a compact DBC based three-phase power module for use in 5 to 20 kW converters for automotive application is described. According to this document, a three dimensional stack of MOSFET chips is provided, which, however, is described not to be assembled with nowadys packaging methods.

The impact of stray inductance on total switching losses is complex, but as a general rule, lower inductance also reduces switching losses. Regarding this, W. Rusche and M. Bäassler, "Influence of stray inductance on high-efficiency IGBT based inverter designs," *Power Electronics Europe*, vol. 7, 2010, generally describes the influence of stray inductance on high efficiency IGBT based inverter designs.

The stray inductance of the commutation cell forms a resonant circuit with the output capacitance of the open semiconductor switch. During switching, this resonant circuit is excited and emits disturbances at a frequency $f=1/2\pi\sqrt{LC}$, which is typically in the EMI regime. The problem will become even worse for devices from wide band gap semiconductor materials (SiC, GaN) with typically higher output capacitance, see J. Biela, M. Schweizer, S. Waffler and J. W. Kolar, "SiC versus Si—Evaluation of Potentials for Performance Improvement of Inverter and DC-DC Converter Systems by SiC Power Semiconductors," IEEE Transactions on Industrial Electronics, vol. 58, no. 7, pp. 2872-2882, 2011.

C. Martin, J. M. Guichon, M. Schanen and R. J. Pasterczyk, "Gate Circuit Layout Optimization of Power Module Regarding Transient Current Imbalance," IEEE Transactions on Power Electronics, vol. 21, pp. 1176-1184, 2006 describes that during switching, the inductive coupling between the stray inductance of the commutation cell and the inductance of the gate circuit disturbs the gate signal. This effect is most significant for several paralleled switches, when slightly different coupling coefficients can produce a dramatic current imbalance during switching.

C. M. Johnson, A. Castellazzi, R. Skuriat, P. Evans, J. Li and P. Agyakwa, "Integrated High Power Modules," in Proceedings of 7th International Conference on Integrated Power Systems (CIPS), 2012, mainly relates to improving thermal management for power semiconductor modules. It is further described that stray inductance of half bridge-modules may be reduced by providing an improved layout, such as by using planar or sandwich packages.

In S. Li, L. M. Tolbert, F. Wang and Z. P. Fang, "Reduction of stray inductance in power electronic modules using basic switching cells," in Proceedings of 2010 IEEE Energy Conversion Congress and Exposition (ECCE), 2010, a packaging for power electronics is described which shall reduce stray inductance.

In P. Beckedahl, M. Spang and O. Tamm, "Breakthrough into the third dimension? Sintered multi-layer flex for ultra-low inductance power modules," in Proceedings of 8th International Conference on Integrated Power Systems (CIPS), it is describes that commutation inductances of a half bridge power module may be reduced if the wire-bonds for topside contacts are replaced by planar bonds using flexible sheets.

WO 2014/021077 A1 describes a multilayer substrate and a power module using a multilayer substrate. According to this document, the multilayer substrate particularly serves for providing a metal wiring having low resistance to conduction.

WO 2014/0117524 A1 describes a power semiconductor module which is described to be capable of being manufactured without performing separate wire bonding. Such a power semiconductor device comprises a multilayer substrate formed by stacking a plurality of substrates and electrically connecting the power semiconductor devices and a lead frame.

US 2012/0267149 A1 describes a method of manufacturing a power module and a power module substrate used in a semiconductor apparatus that controls a large electric current and a large voltage. According to this document, multilayers of ceramic substrates and metal plates are laminated, wherein the metal plates on both sides can be in a connected state. This document, however, does not focus on the specific arrangement of different power semiconductor devices.

US 2009/0039498 A1 relates to power semiconductor modules. Such power semiconductor modules comprise one or more power semiconductor chips which are arranged on a plane ceramic substrate which includes a metallization on at least one side. With regard to the substrate, the latter may be designed as a multilayer substrate which comprises a group of metal layers and a group of ceramic layers.

EP 0 688 053 A1 describes power semiconductor modules especially in a half bridge configuration. Conventional switches and diodes may be supported by substrates as it is generally known in the art. The corresponding substrates can be arranged on two sides of a cooler.

In conventional semiconductor power electronics half-bridge modules, a significant part of the commutation loop is formed in the plane of a ceramic substrate. Such a conventional module package may provide good performance for chips based on silicon as semiconductor, wide bandgap- (WBG-) semiconductors require considerably improved switching performance of the module.

However, there have already been presented several promising packaging concepts. These concepts are trying to optimize electromagnetic interference (EMI) and electromagnetic compatibility (EMC) by low strain inductance (La) module design focusing on optimization of the loop size including power terminals loop contribution. A typical approach is a compact-flat package.

Especially regarding power semiconductor modules having low stray inductance, there is, however, still potential for improvements.

US 2014/0152373 A1 discloses a power semiconductor module, comprising two power semiconductor devices, whereby the power semiconductor devices comprise power semiconductor transistor and a power semiconductor diode. A first substrate is provided for carrying the power semiconductor transistor in a first plane and the first plane lying parallel to the plane of the first substrate. The power semiconductor diode is provided in a second plane and the first plane is positioned between the first substrate and the second plane in a direction normal to the first plane.

SUMMARY OF INVENTION

It is therefore an object of the present invention to provide an improved power semiconductor module which shall obviate at least one of the disadvantages known in the art.

In particular, it is an object of the present invention to provide a power semiconductor module which provides the capability to work with low stray inductance and/or which is easy to build especially by using state of the art techniques.

These objects are at least partly achieved by a power semiconductor module according to claim 1. Preferred embodiments of the present invention are defined in the dependent claims.

The invention relates to a power semiconductor module, comprising at least two power semiconductor devices, wherein the at least two power semiconductor devices comprise at least one power semiconductor transistor and at least one power semiconductor diode, wherein at least a first substrate is provided for carrying the power semiconductor transistor in a first plane, the first plane lying parallel to the plane of the substrate, wherein the power semiconductor diode is provided in a second plane, wherein the first plane is positioned between the substrate, or the plane of the substrate, respectively, and the second plane in a direction normal to the first plane and wherein the first plane is spaced apart from the second plane in a direction normal to the first plane.

Such a power semiconductor module may be formed easily and may provide low stray inductance during work. It may in particular show advantages over conventional planar power semiconductor packages, and over more complex stacked packages like shown in the prior art.

A power semiconductor module thus comprises at least two power semiconductor devices. In fact, it may comprise exactly two or more than two power semiconductor devices. Out of these power semiconductor devices, at least one power semiconductor device is a semiconductor transistor and at least one power semiconductor device is a power semiconductor diode.

Even though the following description is performed for only two power semiconductor devices, it is as well valid for more than two power semiconductor devices or further electronic devices. For example, it may be provided that the power semiconductor module forms a dc-dc, ac-dc, dc-ac, and ac-ac power converter, in which cases additionally to one or more transistors, or switches, respectively and one or more diodes, one or more inductors and one or more capacitors may be provided.

The power semiconductor transistor advantageously is a switch for power applications and may comprise, inter alia, a MOSFET, an IGBT, or the like, as it is generally known in the art. The power semiconductor diode is as well generally known in the art. Such a power semiconductor module may for example form a p-cell, an n-cell, or a half-bridge configuration comprising both a p-cell and an n-cell as it is described in detail down below.

Regarding the position of the respective power semiconductor devices, at least a first substrate is provided, the first substrate having a substrate metallization. As it is generally known as such, the substrate metallization serves for carrying and electrically contacting the power semiconductor transistor.

The substrate may be formed from a ceramic material, such as in a non-limiting manner from alumina ($Al_2O_3$), aluminium nitride (AlN) or beryllium oxide (BeO), or of further materials as generally known in the art. The metallization may exemplarily comprise a copper metallization or a metallization from a further metal.

As an example, the substrate is formed by a main layer being formed from above-defined substrate material with metallizations on both sides, one being provided to attach the chip, the other to connect the substrate to a cooler, for example. The substrate main layer may be realized to provide mechanical support, whereas the upper metallization may provide electrical contact to one or multiple semiconductor devices and the lower metallization may provide contact to said cooler, such as a base plate or an interposer.

Next to the above-defined example, the substrate for carrying the transistor can also be realized as a metallic plate, such as a copper plate, for example.

Further, the power semiconductor transistor is provided in a first plane, the first plane lying parallel to the plane of the substrate. In other words, in a state at which the substrate lies in a horizontal plane, the transistor as well lies in a horizontal plane, which plane is defined to be the first plane. This first plane may be any plane which goes through the transistor and it has a defined distance to the plane of the substrate, the distance being defined in a vertical direction. For example, each plane being described goes through the bottom surface, or backside surface, respectively, of the respective power semiconductor element, which is directly adjacent to the plane of the upper surface of the metallization to which it is attached, as well as of the substrate, in case the substrate is positioned in a horizontal plane.

Next to the above-defined first plane, it is provided that the power semiconductor diode is provided in a second plane. The second plane is arranged parallel to the first plane, wherein the first plane is positioned between the substrate, or the substrate plane, and the second plane in a direction normal to the first plane and wherein the first plane is spaced apart from the second plane in a direction normal to the first plane. In other words, in a state at which the substrate plane is horizontal, the diode as well lies in a horizontal plane, which plane is defined to be the second plane. It has a defined distance to the plane of the substrate, the distance being defined in a vertical direction, wherein the distance of the second plane to the plane of the substrate is larger compared to the distance of the first plane to the plane of the substrate, each in a vertical direction in case the plane of the substrate lies in a horizontal plane. Therefore, referring to a horizontal orientation of the respective planes, a plane which goes through the transistor is spaced apart from the plane of the diode, because of which in a vertical direction, the transistor and the diode are spaced apart from each other.

The vertical distance between the first and second plane in case these proceed horizontally is advantageously chosen such, that the substrate material can withstand the electric field between the metallizations, i.e., it is a function of substrate material and voltage rating. In most cases, the distance between the first and second plane may advantageously be between ≥10 µm to ≤10 mm, preferably between ≥100 µm to ≤1 mm, wherein such distance may be provided in case the first and second planes each proceed through the bottom surface, or back surface, of the transistor and the diode, respectively, in case the first plane and the second plane proceed horizontally.

The diode may also be provided on a substrate, such as a ceramic substrate like described above, or it may be provided on a further support, as it will be described in detail down below. Therefore, even though the substrate for carrying the transistor is called first substrate, a second or further substrate may be present, but is in no way mandatory.

Such a configuration of a power semiconductor module offers a plurality of advantages.

In detail, a configuration, or package, respectively, as described above provides extremely low stray inductance compared to conventional planar packages. As an example, very low stray inductance of the module substrates such reduced by factors of ~5 compared to prior art solutions may under circumstances be reached.

To allow low values for stray inductance, the current paths are at least partly stacked above each other in a vertical direction instead of placing them only next to each other in a horizontal direction in case the substrate is positioned in a horizontal position. In vertical arrangement, the area of the commutation cell is roughly proportional to the vertical separation of the current paths. As vertical distances can be very small (<1 mm), this arrangement allows much smaller loop sizes. Furthermore, the vertical commutation paths interfere less with the gate control circuitry which is typically placed on top of the module.

Low inductive commutation cells may thus be realized by vertically stacking the commutation currents between the transistors and the diodes in different planes each having a distance from each other such as in different layers of the bottom substrate. Therefore strongly improved switching behaviour can be expected because of which such a module is ideal for the packaging of fast switching semiconductors.

With decreasing switching times of modern power semiconductors, especially for novel semiconductor materials like SiC and GaN, stray inductances of power modules have to be decreased drastically to maintain good switching behavior. Stray inductance leads to voltage overshoots during switching events, which increase the switching losses and require de-rating of the semiconductor chips. This indicates the advantages which may be realized by reducing stray inductance like described above.

At the same time, conventional cooling approaches according to the prior art require chips to be located laterally next to each other to enable cooling through a common cold plate. Stacked chips require double-sided cooling or cooling through a common interposer. Cooling through multi-layer DBCs is less efficient due to the higher thermal resistance of the DBC layers.

According to the configuration of the power semiconductor module as described above, however, good thermal properties may be achieved. The thermal resistance of the transistor such as of the MOSFETs is equal to standard DBC-based substrates according to prior art. The thermal resistance of the diodes may slightly worse due to a potentially present additional layer, such as of a DBC layer. However, as switching losses accumulate almost exclusively in the transistor, or the switch, respectively, this is acceptable for fast switching semiconductor modules and does not cause significant cooling problems. Therefore, even though the diode may be placed not directly adjacent to a cooling device, the thermal behaviour of the power semiconductor module as described above is not deteriorated significantly.

The thermal resistance of a power semiconductor module as described here is significantly lower compared conventional multilayer power modules according to the prior art. Furthermore, as no flip-chip is strictly required, all chips can be cooled with maximum heat transfer area through their backsides.

Additionally, it may be provided that the diodes are additionally cooled through the power terminals, which further improves the thermal behaviour of the power semiconductor module.

Apart from the above, the module layout as such is compatible to present power electronics modules. In particular, the electrical terminals can still be located on top of the power module. Furthermore, the module can be cooled conventionally through a common base-plate which can be grounded.

Thus, the power semiconductor module as described above can be constructed using conventional assembly techniques and standard packaging techniques, such as wire bond connections such as for topside connection.

Instead of a multi-layer substrate, according to an embodiment it may be sufficient to use a 2-layer substrate with further layers added as islands on top. Therefore, an easy construction may be realized.

Such a power semiconductor module is furthermore compatible with respect to terminal arrangement and cooling, with existing power electronics package layouts. A requirement for flipping the chips, or the transistors, respectively, is not given, even though under circumstances, flipping the chips may be advantageous in a power semiconductor module as described here.

In most practical power electronics converter topologies, the switch has to sustain most of the losses. Already with state-of-the-art SiC or GaN Schottky diodes, reverse recovery losses in the diode are strongly reduced, thereby increasing the imbalance in the distribution of losses.

To summarize, a power semiconductor module like described above enables low inductive power modules with good thermal properties using a 3D-package structure from a multi-layer substrate.

According to an embodiment, the first substrate is connected, and thus in thermally contact, to a cooling device. According to this embodiment, the thermal behaviour of the power semiconductor module may be enhanced especially effectively. In detail, due to the fact that the transistor, or switch, respectively, is located on the first substrate, or its substrate metallization, the cooling effect is especially effective to such power semiconductor devices, which require intense cooling. In contrast to the power semiconductor transistor, the smaller loss density on the semiconductor diodes makes it possible to work with reduced cooling power, so that the provision of further layers between the diode and the cooling device is not detrimental.

Regarding the cooling device, the latter may for example be a conventional baseplate. However, the cooling device is of course not limited to such an example as described above. Further, the cooling device, such as the baseplate may be fixed to a metallization which is provided at the bottom side of the substrate, or its ceramic main layer, respectively, whereas the transistor is provided at a top side metallization, as it is generally known in the art. The same may apply correspondingly in case the substrate is formed of a metallic plate, for example, as the skilled person will derive unambiguously from the above description.

According to a further embodiment, the power semiconductor devices form at least one of a P-cell and an N-cell. Thus, according to this embodiment, at least one of a P-cell and an N-cell is provided in the power semiconductor module. This may be especially advantageous, as a P-cell or an N-cell may as such be a fundamental working block for forming electrical devices being based on power semiconductor modules. In some applications, e.g. DC/DC converters with unidirectional energy flow, only a P-cell or an N-cell is required and there is no need for, exemplarily, a full half-bridge module.

Therefore, especially in case the power semiconductor devices form at least one of a P-cell and an N-cell, a broad application range may be achieved allowing the power semiconductor module according to the present invention to be used in many applications.

According to a further embodiment, the power semiconductor devices form both a P-cell and an N-cell, wherein power semiconductor devices of the P-cell are arranged on electrically conductive structures and wherein power semiconductor devices of the N-cell are provided on electrically conductive structures, wherein the electrically conductive structures of the P-cell are separated from the electrically conductive structures of the N-cell. In other words, the P-cell and the N-cell are arranged by using different electrically conductive structures, such as metallizations. Therefore, the electrically conductive structures of the P-cell and N-cell respectively, which are used for carrying the power semiconductor devices, are separated from the electrically conductive structures of the respective different cell such, that the structures of the respective different cell as such have no mechanical contact. Due to the fact that the P-cell and the N-cell may be connected to form a half bridge module, an indirect electrical contact may be present. However, the structures as such are separated and thus electrically insulated and spatially separated from another.

It may be provided that the power semiconductor devices of the P-cell are arranged on at least one substrate or on a plurality of substrates, wherein the at least one substrate or the plurality of substrates of the P-cell are separated from the at least one or the plurality of substrates which are used for positioning the power semiconductor devices of the N-cell. The substrates of the P-cell and the N-cell may thereby be formed identically, or they may differ from each other. Again, each of the P-cell and the N-cell may comprise a substrate for the transistor and substrate for the diode, or a substrate for the transistor may be provided and a different support for the diode, like it is described in detail down below.

This embodiment showing a separation of the P-cell and the N-cell allows forming half-bridge modules especially easily. In detail, half-bridge modules may be formed instead of a combination of a switch and an anti-parallel diode for power electronics, such as for a converter, by combining each of a P-cell and an N-cell in a parallel manner.

This approach strongly reduces stray inductance in converter realizations by reducing the need of package-external interconnections in the commutation path.

A further advantage of a separation of the P-cell and the N-cell as described above is the possibility of always placing the transistor, or switch, respectively, on a respective first substrate which in turn allows an improved cooling and thus thermal behaviour of the power semiconductor module, as it is described above.

As further advantages, only one gate control signal is required per substrate. This allows a simple and further highly flexible substrate and module design and the easy possibility of paralleling the substrates.

The above-described advantages may thereby be realized without compromising the performance of the module.

According to the invention, at least the first substrate is based on a direct bonded copper substrate (DBC-substrate). A direct bonded copper substrate is mainly composed of a ceramic tile, such as commonly formed from alumina or further above named substrate materials, with a sheet of copper bonded to one or both sides by a high-temperature oxidation process. The ceramic tile acts as substrate main layer and the copper as a substrate metallization. The copper may be etched using PCB technology to form an electric circuit. Such a substrate is particularly easy to form and further has advantages with the thermal behaviour of the module. Apart from that, especially DBC-substrates offer advantages especially with a broad application range and design adaptions regarding the formation of the module. In detail, DBC substrates may be adapted to the desired application range easily. Therefore, the power semiconductor module as described above may be formed and adapted very easily.

Two direct-bonded copper substrates, i.e. the first substrate and the second substrate, could be stacked one onto the other. In this sense, next to the first substrate, a second substrate for carrying the diode is provided which is located onto the first substrate. With this regard, both the first and the second substrate may be formed very easily and may provide the advantages as described above with regard to DBC-substrates. According to these two direct-bonded copper substrates, two ceramic substrates, or substrate main layers, respectively, may be provided, wherein three metallic layers, or metallization layers, respectively, may be provided, each one above each substrates, and such one between the substrates, and one below the substrates. The metallic layer between the substrates may be formed by two sublayers, wherein each of the sublayers is originated from upper or lower metallizations of the stacked substrates.

The lower metallization may be provided, for example, in order to provide a thermally conductive connection to a baseplate. Further, an easy fixation to the baseplate may be allowed. The upper DBC-substrate for carrying the diode may thereby have a smaller extension compared to the first substrate, such as in the form of an island being provided on the lower substrate, or first substrate, respectively. This may offer low spatial requirements and further easy positioning and connecting the respective power semiconductor devices. For example, the transistor may be placed next to the upper substrate. The additional DBC-layer may be attached, for example, by means of soldering, sintering or brazing. Therefore, it may be advantageous that the upper DBC layer comprises a metallization both on its upper side and on its lower side.

According to the invention, the first substrate is a direct-bonded copper substrate for carrying the transistor on which first substrate a layer of a printed circuit board (PCB) is provided for carrying, or supporting, the diode. This again is a very easy embodiment for forming a power semiconductor module as described above. In fact, PCB-technique may be integrated into the respective procedure for forming the module without significant problems. The PCB layer may as well be located such, that it has a smaller dimension compared to the first substrate and may thus again be formed island-like on the first substrate. The additional PCB-layer may be attached by low temperature soldering, sintering, or it may be glued with an particularly electrically conductive adhesive. As it is generally known in the art, a PCB layer comprises a non-conductive substrate, such as formed from an epoxy material, onto which an electrically conductive structure, such as a copper structure, may be located. It may be provided that a metallization is formed on the upper as well as the lower surface of the non-conductive substrate. The metallization on top supports and electrically connects to the chips. The metallization on bottom is used for, e.g., brazing, sintering, gluing on the top metallization of the first substrate. It may be easier in general to connect metallic rather than insulating materials, especially thermally. Especially in this case, the electrically conductive adhesive may be advantageous.

According to the invention and as an alternative to the PCB layer mentioned before, the first substrate is a direct-bonded copper substrate for carrying the transistor on which first substrate a foil is provided for carrying, or supporting, the diode, wherein the foil comprises an electrically insulating main body and an electrically conductive structure provided thereon for carrying the diode. The foil may be attached, for example, by means of soldering or sintering. Again, the provision of the second carrier for the diode may be formed very easily and may be integrated into the process without significant problems. The foil according to this embodiment may comprise a plastic main body being formed from an electrically insulating material, such as polyester or polyimide, such as the one being commercially available under its name Kapton by the firm DuPont. The main body may comprise one or more metallizations, such as formed from copper, on the top side and optionally on the bottom side in order to provide a good fixation to the lower substrate by the backside metallization, or bottom side metallization and further for electrically contacting the diode by the front side metallization, or top side metallization.

According to a further embodiment, the transistor is formed based on a wide bandgap semiconductor. Especially with regard to wide bandgap semiconductors, the stray inductance should be decreased in order to maintain a good switching behaviour. Therefore, the power semiconductor module as described above is especially advantageous for such wide bandgap semiconductors being present in the power semiconductor transistors. Such semiconductor devices are based for example on silicon carbide (SiC) or gallium nitride (GaN). As an explanation but without being limited thereto, "wide" bandgap semiconductors typically refer to a material with a band gap of at least three eV. Such a band gap is significantly greater than these of the commonly used semiconductors, such as silicon (1.1 eV) or gallium arsenide (1.4 eV).

According to a further embodiment, the power semiconductor module comprises at least one interposer. An interposer is particularly a cooler which may be formed of a metallic block, such as of molybdenum, which carriers a cooling function. When providing an interposer, substrates which carry respective power semiconductor devices may be arranged on multiple sides of the interposer and thus exemplarily on the lower side and on the upper side of the interposer, so that the interposer is positioned between two substrates in a direction normal to the respective substrate planes. Regarding this embodiment, especially by positioning the transistor and the diode in different planes as described above, the above-described advantages may be significantly enhanced by using an interposer.

Apart from that, especially a module having P-/N-cell separation as described above is very beneficial for packages having an interposer, such as for automotive applications. This is due to the fact that the P-/N-cell separation makes stray inductance independent of interposer thickness and material. Therefore, the above-described advantages of reduced stray inductance may be especially effectively combined with an interposer and the highly flexible and easy module design being advantageous therefore.

Furthermore, especially the embodiment as described above in which a P-/N-cell separation is provided, this embodiment may be highly advantageous in case the substrates are located far away from each other, such as by using an interposer, as only one gate control signal has to be routed to the lower side of the interposer. Therefore, the module design may be simplified in a large amount.

BRIEF DESCRIPTION OF DRAWINGS

Additional features, characteristics and advantages of the subject-matter of the invention are disclosed in the subclaims, the figures and the following description of the respective figures and examples, which—in an exemplary fashion—show embodiments and examples of a semiconductor module according to the invention.

In the figures.

DESCRIPTION OF EMBODIMENTS

Figure 1:
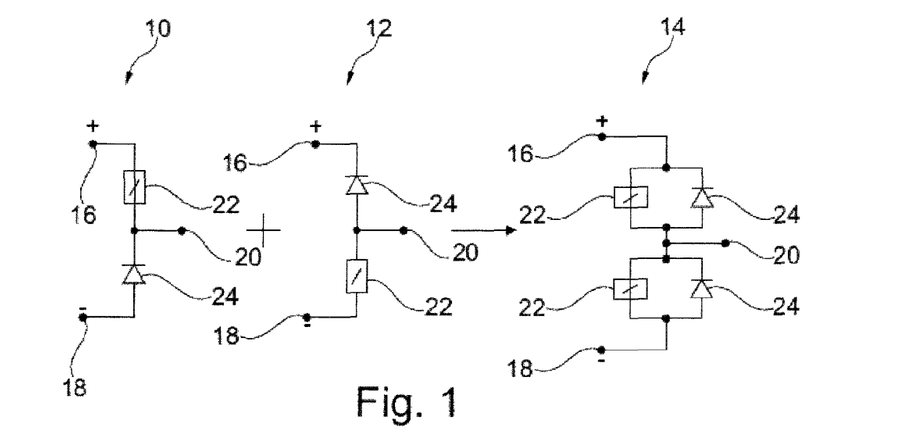
FIG. 1 shows the topology of a half-bridge module which may be formed by a power semiconductor module according to the invention.

In FIG. 1, an embodiment of an electronic circuit topology is shown, which may be realized by means of the power semiconductor module according to the invention.

In detail, a P-cell 10 is shown as well as an N-cell 12, which may form a half-bridge module 14 in a parallel combination, or connection, respectively. Regarding the P-cell 10 and the N-cell 12, these cells comprise a DC+ terminal, or positive DC-connection 16 and a DC− terminal, or negative DC-connection 18, respectively, as well as an AC-connection 20. Further, a transistor 22 working as a switch is provided, which may be formed by a MOSFET, IGBT or the like. Additionally, a diode 24 is provided. Further, the AC-connection 20 is provided which, at the P-cell 10, may connect the circuit to the positive lead of a current-source or inductor and which, at the N-cell, may connect the circuit to the negative lead of a current-source or inductor.

As stated above, providing low stray inductance in a circuit may be a challenge especially for fast switching devices. With this regard, stray inductance is defined as the loop inductance of the current path from the positive DC-connection 16 to the negative DC-connection 18. Depending on the flow direction of the load current, it passes through high-side switch and low side diode or high side diode and low side switch, as it may be anticipated from FIG. 1.

In order to reduce stray inductance for example in a circuit such as in a P-cell 10, an N-cell 12, or a half-bridge module 14, a power semiconductor module may be formed as will be shown down below.

Figure 2:
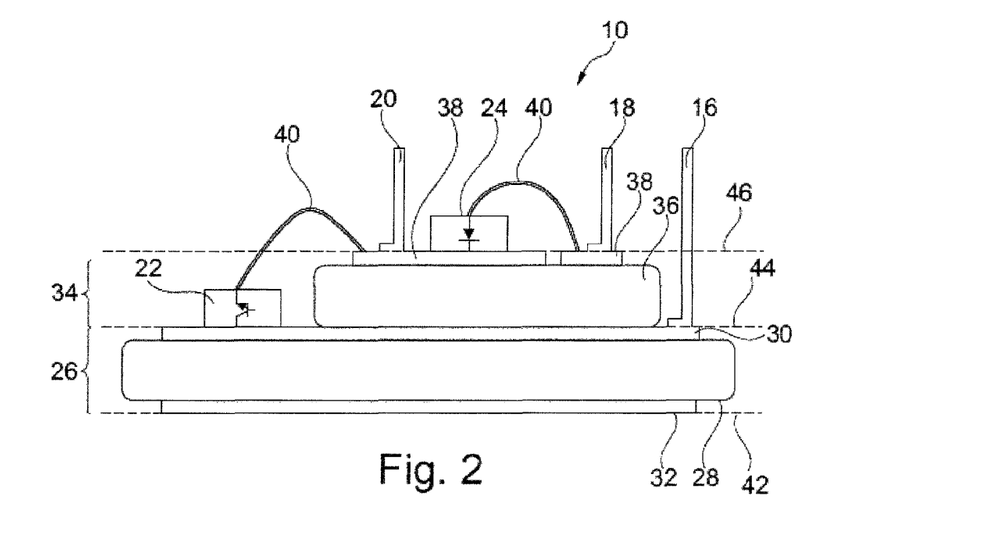
FIG. 2 shows an embodiment of a P-cell which may be formed by a power semiconductor module according to the invention.
Figure 3:
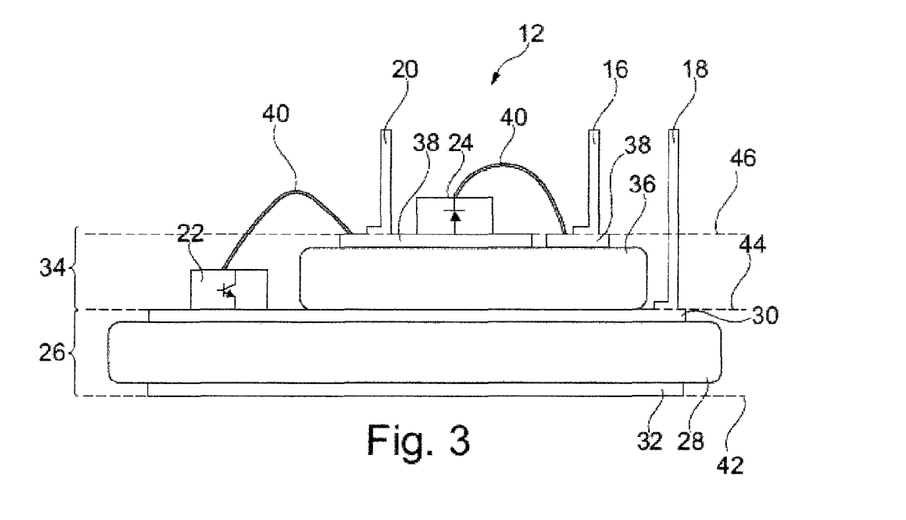
FIG. 3 shows an embodiment of an N-cell which may be formed by a power semiconductor module according to the invention.

FIG. 2 shows an example of a P-cell 10 and FIG. 3 shows an example of an N-cell 12, wherein both the P-cell 10 of FIG. 2 and the N-cell 12 of FIG. 3 may form a half-bridge module 14 as power semiconductor module by connecting them in parallel.

In detail, the P-cell 10 of FIG. 2 provides two power semiconductor devices, one of which being a transistor 22, or switch, respectively, and one of which being a diode 24. The transistor 22 is located on a substrate 26, which is formed as a DBC substrate. It comprises a substrate main layer 28 which carries an upper metallization 30 and a lower metallization 32. The lower metallization 32 may be connected to a baseplate, whereas the upper metallization 30 carries and contacts the transistor 22 and a positive DC-connection 16.

On top of the substrate 26, a further substrate 34 being a second substrate is provided, which again is a DBC substrate. It is formed having smaller dimensions compared to the substrate 26 and it may thus be called an island on the lower substrate 26. The substrate 34 provides a substrate main layer 36 and a metallization 38. The upper substrate 34, or its substrate metallization 38, respectively, carries the diode 24 as well as an AC-connection 20 and a negative DC-connection 18. The metallization 38 is connected to the transistor 22 by means of a bond wire 40. The diode 24 is connected to the negative DC-connection 18 by means of a bond wire 40.

The N-cell 12, which is shown in FIG. 3, is built respectively, wherein in the following, the differences are described. In particular, in order to form the N-cell 12, the transistor 22 is positioned by means of flip-chip technique and further, the diode 24 is respectively connected to the positive DC-connection 16 as well as to the AC-connection 20, as it will be clear from FIG. 3. The transistor 22 is located on the metallization 30 which also carries the negative DC-connection 18.

According to the embodiment of FIGS. 2 and 3, it is possible to use the same substrates and particularly the same lower substrate 26 by flipping the transistor 22 in the N-cell 12. This allows an easy production method as the substrate 26 may be reused.

In this configuration, it is possible to place only the diode 24 on the additional islands where cooling efficiency is lower. The transistor 22, or switch, respectively, is still cooled very efficiently by placing it directly on the lower substrate 26. Stray inductance is extremely low because the commutation path is contained completely in the paper plane.

Generally, it may be provided that the transistor 22 and the diode 24 are arranged in one vertical plane, so that the commutation path runs in one vertical plane, only, in case the substrate lies in a horizontal plane.

The embodiment according to FIGS. 2 and 3 thus show an arrangement of chips on a three-layer DBC which realizes a P-cell 10 or an N-cell 12 where the semiconductor switch 22 is always positioned on the middle layer, i.e. the metallization 30, and the power semiconductor diode 24 is always located on the upper layer, i.e. the metallization 38. The proposed arrangement offers very low stray inductance and good thermal properties.

Additionally, regarding the cells of FIGS. 2 and 3, it can be seen, that the power semiconductor transistor 22 is located in a first plane 44, the first plane 44 lying parallel to the plane 42 of the substrate 26, and that the power semiconductor diode 24 is provided in a second plane 46, wherein the first plane 44 is positioned between the substrate 26 and the second plane 46 in a direction normal to the first plane 44 and wherein the first plane 44 is spaced apart from the second plane 46 in a direction normal to the first plane 44. In other words, the transistor 22 is spaced apart from the diode 24 in a vertical direction in case the first 44 and second 46 plane are arranged in a horizontal plane. This allows a significantly reduced stray inductance.

Figure 4:
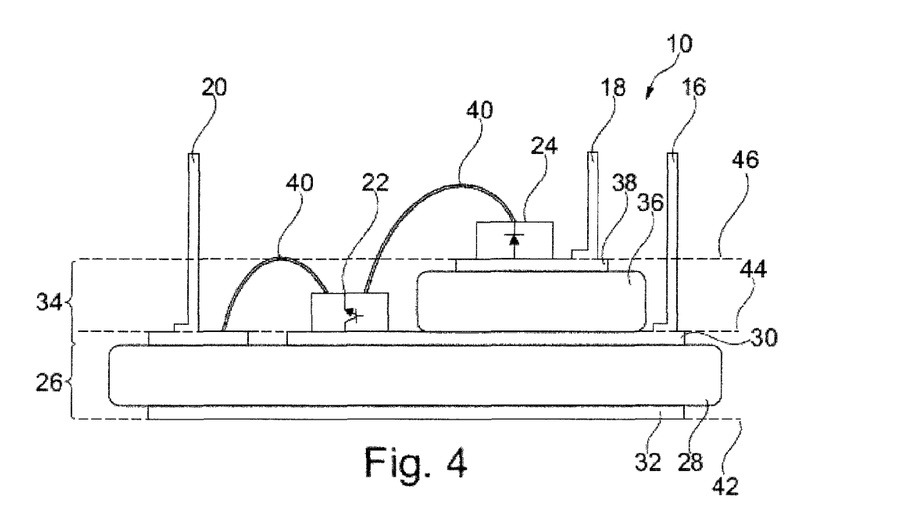
FIG. 4 shows a further embodiment of a P-cell which may be formed by a power semiconductor module according to the invention.
Figure 5:
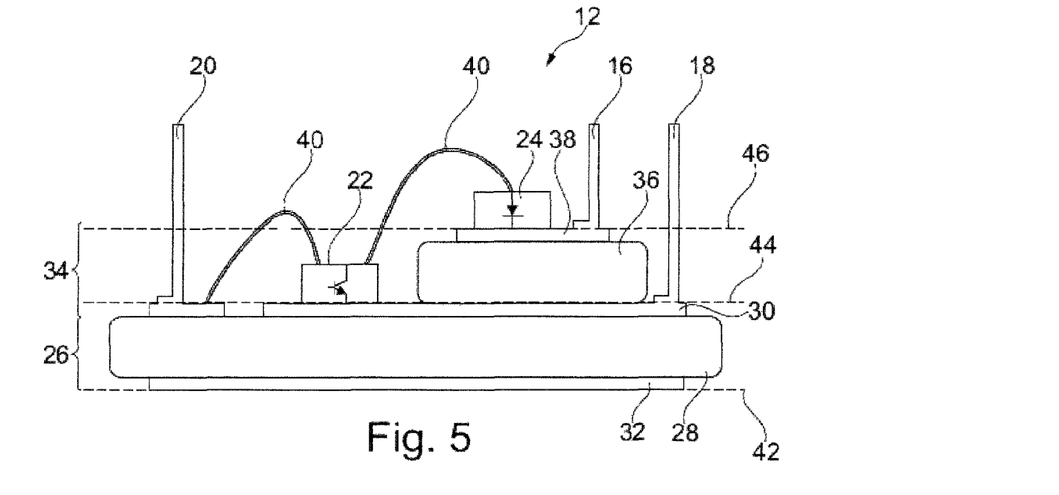
FIG. 5 shows a further embodiment of an N-cell which may be formed by a power semiconductor module according to the invention.

FIG. 4 shows a further embodiment of a P-cell 10 and FIG. 5 shows a further embodiment of an N-cell 12, which again may be combined in parallel to form a half-bridge module 14. Generally, the same reference numbers refer to the same components compared to FIGS. 2 and 3.

According to FIGS. 4 and 5, again, the same substrate 26 may be used because of which the transistors 22 of the N-cell (FIG. 5) are flipped. It can further be seen that the AC-connection 20 is located at a part of the metallization 30. The further devices are respectively interconnected as it can unambiguously be seen from FIGS. 4 and 5, respectively.

Figure 6:
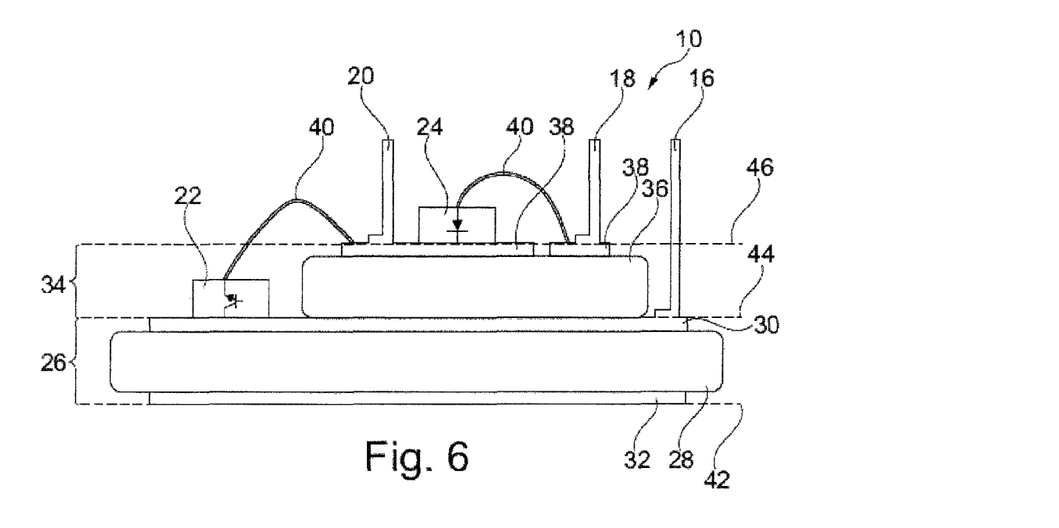
FIG. 6 shows a further embodiment of a P-cell which may be formed by a power semiconductor module according to the invention.
Figure 7:
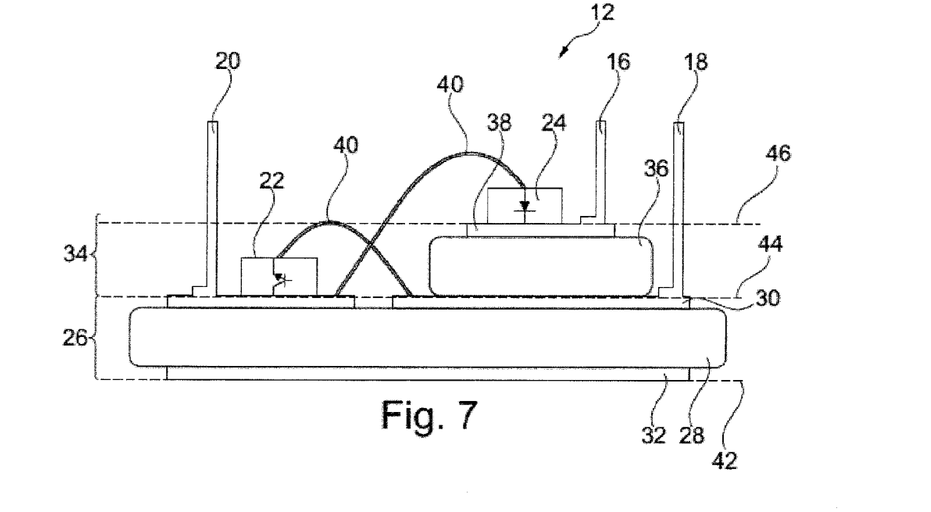
FIG. 7 shows a further embodiment of an N-cell which may be formed by a power semiconductor module according to the invention.

FIG. 6 shows a further embodiment of a P-cell 10 and FIG. 7 shows a further embodiment of an N-cell 12, which again may be combined in parallel to form a half-bridge module 14.

With this regard, an alternative realization of the P-cell 10 and N-Cell 12 is shown. According to FIGS. 6 and 7, different substrates 26 are used for the P-cell 10 and the N-cell 12. Therefore, a separation of the P-cell 10 and the N-cell 12 may be realized. This realization has substantially equally low stray inductance as the embodiment shown in FIGS. 2 to 5. At the same time, there is no need for a flip-chip of the transistors 22 anymore.

Figure 8:
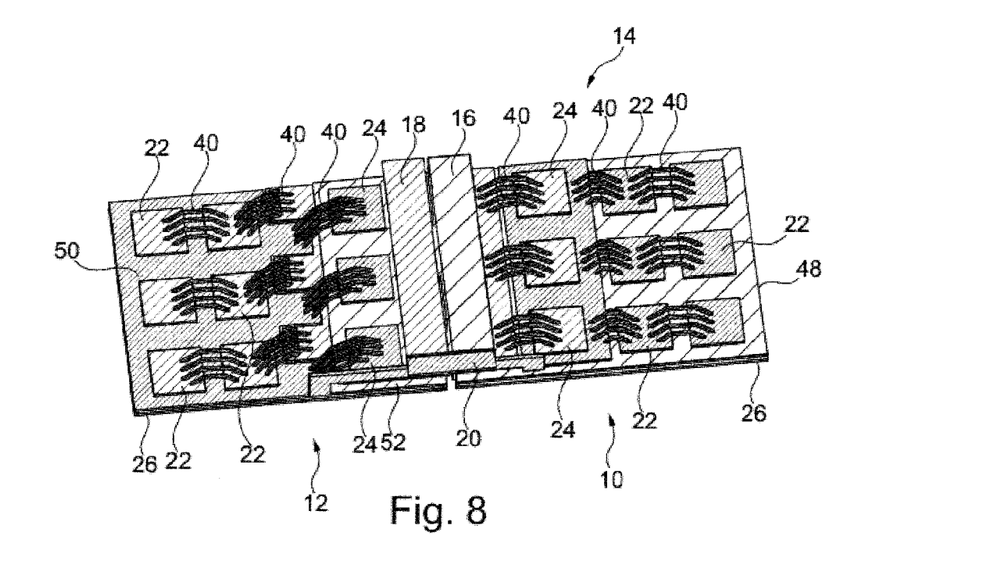
FIG. 8 shows the configuration of a half-bridge which may be formed by a power semiconductor module according to the invention.

FIG. 8 shows an example of a full half-bridge module 14 comprising a P-cell and 10 an N-Cell 12. Each cell carries 6 MOSFETs and 3 diodes. Each chip has a footprint of 5 mm×5 mm. The substrate 26 is realized as a DBC substrate with patterned topside. All objects on DC+ are shown in a first shading 48, all objects on AC in a second shading 50, and all objects on DC− in a third shading 52. The DC terminals have been realized to have an inductance which is significantly lower than the inductance of the substrates.

In detail, FIG. 8 shows a realization of the proposed 2.5 D power module with P/N cell separation, wherein the P-Cell 10 is shown on the right hand side, the N-Cell 12 on the left hand side. The stray inductance as simulated using the software ANSYS Q3D Extractor, the latter allowing to construct an equivalent circuit model for the power module using 3D Finite Element (FEM) simulation is approximately 1.3 nH.

Regarding the different embodiments of the power semiconductor modules according to the invention such as described above, the following may be noted. Conventional half-bridge modules 14 can be formed by connecting P-cells 10 and N-Cells 12 in parallel. The corresponding substrates 26 can be arranged on the same cooler to have a common baseplate. To reduce footprint, it is also possible to arrange the two substrates 26 on the two sides of an interposer cooler.

As the topside of the switches, or transistors 22, respectively, is easily accessible, topside electrical connection can easily be established with conventional means. More specifically, topside contacts can be realized using conventional wire-bonds 40, for example.

Generally and independently of the respective embodiment, even lower values for stray inductance can be realized if the wire-bonds 40 for topside contacts are replaced by planar bonds using flexible sheets of copper.

As the DC+ and DC− terminals are located at the same side of the power module, external terminals can be realized with low additional stray inductance.

Mechanical stability and reliability is very good due to properties of substrate 26, which may be formed as direct bonded copper substrate.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SIGNS LIST

10 P-cell
12 N-cell
14 half-bridge module
16 positive DC connection
18 negative DC connection
20 AC connection
22 transistor
24 diode
26 first substrate
28 main layer
30 metallization
32 metallization
34 second substrate
36 main layer
38 metallization
40 bond wire
42 substrate plane
44 first plane
46 second plane
48 first shading referring to a first potential
50 second shading referring to a second potential
52 third shading referring to a third potential

The invention claimed is:

1. A power semiconductor module, comprising:
at least two power semiconductor devices, wherein the at least two power semiconductor devices comprise at least one power semiconductor transistor and at least one power semiconductor diode,
wherein at least a first substrate is provided for carrying the power semiconductor transistor in a first plane, the first plane lying parallel to the plane of the first substrate,
wherein at least a second substrate is provided for carrying the power semiconductor diode, the second substrate being disposed between the first substrate and the power semiconductor diode,
wherein the power semiconductor diode is provided in a second plane, wherein the first plane is positioned between the first substrate and the second plane in a direction normal to the first plane,
wherein the first plane is spaced apart from the second plane in a direction normal to the first plane,
wherein the first substrate is based on a direct bonded copper substrate and the first substrate is a direct-bonded copper substrate for carrying the transistor, and
wherein the second substrate comprises a layer of a printed circuit board for carrying the diode.

2. The power semiconductor module according to claim 1, wherein the first substrate is connected to a cooling device.

3. The power semiconductor module according to claim 1, wherein the power semiconductor devices form at least one of a P-cell and an N-cell.

4. The power semiconductor module according to claim 1, wherein the transistor is formed based on a wide bandgap semiconductor.

5. The power semiconductor module according to claim 1, wherein the power semiconductor module comprises at least one interposer.

6. The power semiconductor module according to claim 2, wherein the power semiconductor devices form at least one of a P-cell and an N-cell.

7. The power semiconductor module according to claim 2, wherein the transistor is formed based on a wide bandgap semiconductor.

8. The power semiconductor module according to claim 2, wherein the power semiconductor module comprises at least one interposer.

9. The power semiconductor module according to claim 6, wherein the power semiconductor devices form both a P-cell and an N-cell, wherein the power semiconductor devices of the P-cell are arranged on electrically conductive structures and wherein power semiconductor devices of the N-cell are provided on electrically conductive structures, wherein the electrically conductive structures of the P-cell are separated from the electrically conductive structures of the N-cell.

10. The power semiconductor module according to claim 3, wherein the power semiconductor devices form both a P-cell and an N-cell, wherein the power semiconductor devices of the P-cell are arranged on electrically conductive structures and wherein power semiconductor devices of the N-cell are provided on electrically conductive structures, wherein the electrically conductive structures of the P-cell are separated from the electrically conductive structures of the N-cell.

11. The power semiconductor module according to claim 3, wherein the transistor is formed based on a wide bandgap semiconductor.

12. The power semiconductor module according to claim 3, wherein the power semiconductor module comprises at least one interposer.

13. The power semiconductor module according to claim 10, wherein the power semiconductor module comprises at least one interposer.

14. The power semiconductor module according to claim 10, wherein the transistor is formed based on a wide bandgap semiconductor.

15. A power semiconductor module, comprising:
at least two power semiconductor devices, wherein the at least two power semiconductor devices comprise at least one power semiconductor transistor and at least one power semiconductor diode,
wherein at least a first substrate is provided for carrying the power semiconductor transistor in a first plane, the first plane lying parallel to the plane of the first substrate,
wherein at least a second substrate is provided for carrying the power semiconductor diode, the second substrate being disposed between the first substrate and the power semiconductor diode,
wherein the power semiconductor diode is provided in a second plane, wherein the first plane is positioned between the first substrate and the second plane in a direction normal to the first plane,
wherein the first plane is spaced apart from the second plane in a direction normal to the first plane,
wherein the first substrate is based on a direct bonded copper substrate and the first substrate is a direct-bonded copper substrate for carrying the transistor, and
wherein the second substrate comprises a foil for carrying the diode, wherein the foil comprises an electrically insulating main body and an electrically conductive structure provided thereon for carrying the diode,
on which first substrate a foil is provided for carrying the diode, wherein the foil comprises an electrically insulating main body and an electrically conductive structure provided thereon for carrying the diode.

16. The power semiconductor module according to claim 15, wherein the first substrate is connected to a cooling device.

17. The power semiconductor module according to claim 15, wherein the power semiconductor devices form at least one of a P-cell and an N-cell.

18. The power semiconductor module according to claim 15, wherein the transistor is formed based on a wide bandgap semiconductor.

19. The power semiconductor module according to claim 15, wherein the power semiconductor module comprises at least one interposer.

20. The power semiconductor module according to claim 17, wherein the power semiconductor devices form both a P-cell and an N-cell, wherein the power semiconductor devices of the P-cell are arranged on electrically conductive structures and wherein power semiconductor devices of the N-cell are provided on electrically conductive structures, wherein the electrically conductive structures of the P-cell are separated from the electrically conductive structures of the N-cell.

* * * * *